US006088604A

United States Patent [19]

Williams et al.

[11] Patent Number: 6,088,604

[45] Date of Patent: *Jul. 11, 2000

[54] SUPERCONDUCTOR-NORMAL CONDUCTOR JUNCTION DEVICE

[75] Inventors: David Arfon Williams; Adrian Michael Marsh; Haroon Ahmed; Bruce William Alphenaar, all of Cambridge, United Kingdom

[73] Assignee: Hitachi, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/375,445

[22] Filed: Jan. 19, 1995

[30] Foreign Application Priority Data

Jan. 25, 1994 [GB] United Kingdom .................. 9401357

[51] Int. Cl.[7] .......................... B32B 12/00; H01B 12/00; H01L 39/00

[52] U.S. Cl. ........................... 505/220; 257/32; 257/661; 505/191; 505/236; 505/237

[58] Field of Search ................................ 257/31, 32, 33, 257/34, 35, 36, 37, 38, 39, 661, 662, 663; 505/181, 182, 190, 191, 193, 220, 235, 236, 237, 238, 310, 329, 330, 702, 703, 706, 726, 812, 813, 814, 832, 848, 856, 857, 865, 866, 873, 874, 922, 923, 925

[56] References Cited

U.S. PATENT DOCUMENTS

| | | | |
|---|---|---|---|
| 3,916,432 | 10/1975 | Huebener et al. | 257/662 |
| 4,660,061 | 4/1987 | Sweeny et al. | 257/661 |
| 4,837,609 | 6/1989 | Gurvitch et al. | 257/663 |
| 5,145,832 | 9/1992 | Harshavardhan et al. | 257/663 |
| 5,326,988 | 7/1994 | Ishida | 257/661 |
| 5,430,013 | 7/1995 | Inanda et al. | 257/662 |
| 5,455,451 | 10/1995 | Usagawa et al. | 257/661 |

FOREIGN PATENT DOCUMENTS

| | | |
|---|---|---|
| 0 163 031 | 12/1985 | European Pat. Off. . |
| 0 276 746 | 8/1988 | European Pat. Off. . |
| 0 371 426 | 6/1990 | European Pat. Off. . |
| 0 458 013 | 11/1991 | European Pat. Off. . |
| 6-196 767 | 7/1994 | Japan . |

OTHER PUBLICATIONS

Physical Review B, vol. 47, No. 13, Apr. 1, 1993; Hayato Nakano et al.; pp. 7986–7994: Quasiparticle Interferometer Controlled by Quantum–Correlated Andreev Reflection.

Appl. Phys. Lett. vol. 60, No. 4, Jan. 27, 1992; Gang Xiao et al., pp. 504–506: Superconducting Electron Focusing and Guiding Based on the Andreev Reflection Mechanism.

*Primary Examiner*—Mahshid Saadat
*Assistant Examiner*—Allan R. Wilson
*Attorney, Agent, or Firm*—Kenyon & Kenyon

[57] ABSTRACT

A superconductor-normal conductor junction device comprises first and second regions (1, 3) of normal material forming first and second junctions with a superconducting material (2), the Fermi level of the first region of normal material being so arranged relative to a given energy level in the superconducting material that charge carriers in the first normal material undergo Andreev reflection at the first junction, resulting in pairs of the charge carriers entering said given energy level in the superconducting material, and the Fermi level of the second region of normal material being so arranged relative to said given level in the superconducting material that said charge carriers conduct from the superconducting material through the second region.

10 Claims, 3 Drawing Sheets

(LOW TRANSMISSION)

(HIGH TRANSMISSION)

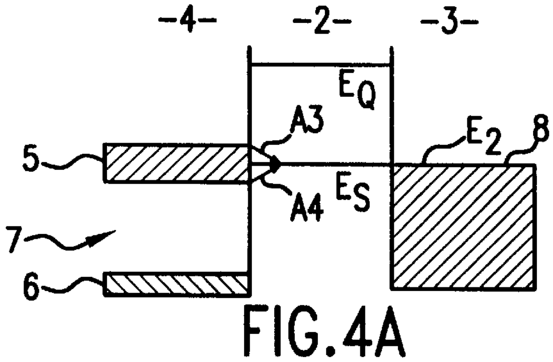
FIG.4A
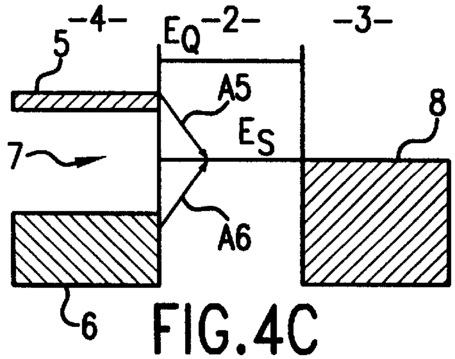
FIG.4C
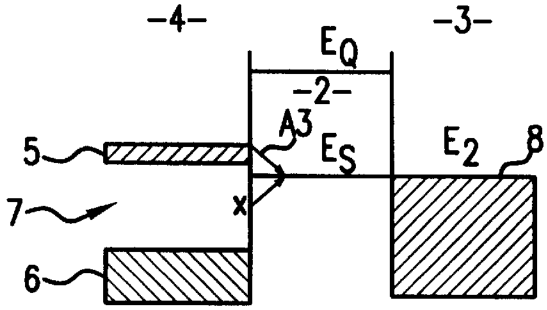
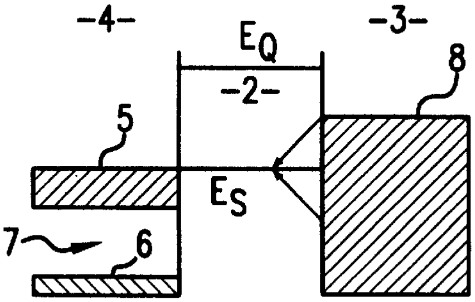
FIG.4B
FIG.4D
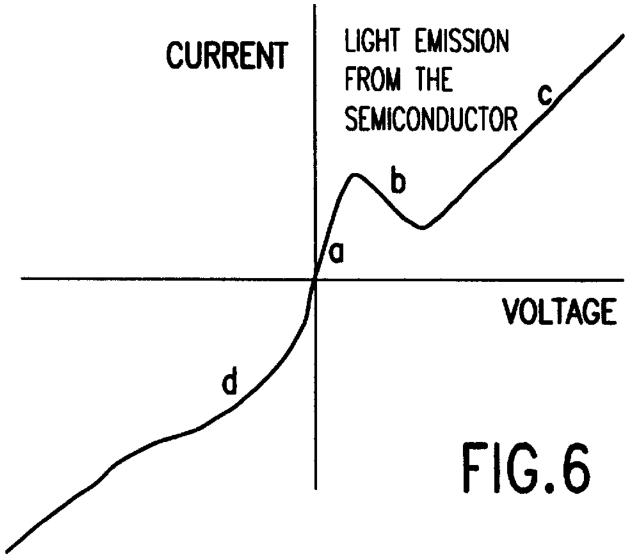
FIG.6

SUPERCONDUCTOR-NORMAL CONDUCTOR JUNCTION DEVICE

FIELD OF THE INVENTION

This invention relates to a superconductor-normal conductor junction device.

BACKGROUND OF THE INVENTION

When a superconductor is in contact with a normal material, in equilibrium, the Fermi level of the normal material aligns with the centre of the gap of width 2 $\Delta$ between the quasiparticle energy $E_Q$ and the pair energy $E_S$ associated with a superconductor. A barrier region exists between the normal and superconducting regions, the height of which depends upon the two materials involved and the fabrication procedures used. In most junctions which have been fabricated hitherto, the barrier is sufficiently high or wide enough that current cannot flow until the magnitude of the applied bias is greater than half the superconductor gap $\Delta$, bringing the Fermi level of the normal conducting material $E_1$ in line with either the pair energy $E_S$ or the quasiparticle energy $E_Q$.

For appropriate material conditions, a different process known as Andreev reflection can occur. In this process, when an electron is incident upon the barrier, from within the normal material, it can propagate into the superconducting material only if it pairs with another electron, usually from the normal side. To conserve energy and momentum, a reflected hole, with reverse group velocity and negative effective mass is formed and travels back along the original electron path. Thus, two electrons can simultaneously tunnel across the barrier, one from the Fermi energy and one from an energy level as much below the pair energy as the Fermi level is above. This give an excess current, when compared with normal electron transport since pairs of electrons are formed in the superconducting material. A review of Andreev reflection is given in A. Andreev, Zh, Eksp Teor, Fiz 46, 1823 (1964) [Sov. Phys.-JETP 19, 1228 (1964)].

Hitherto, systems involving two such junctions have not been considered and the present invention resides in the realisation that by the provision of two such junctions, electron transport can occur with the application of a much lower offset bias than hitherto.

SUMMARY OF THE INVENTION

In accordance with the invention, a superconductor-normal conductor junction device comprises: a region of superconducting material; a first region of normal material forming a first junction with the superconducting material; and a second region of normal material forming a second junction with the superconducting material. In accordance with the invention the Fermi level of the first region of normal material is so arranged relative to a given energy level in the superconducting material that charge carriers in the first normal material undergo Andreev reflection at the first junction, resulting in pairs of the charge carriers entering said given energy level in the superconducting material, and the Fermi level of the second region of normal material is so arranged relative to said given level in the superconducting material that said charge carriers conduct from the superconducting material through the second region.

The superconducting material can be used as a contact wire in a semiconductor structure, with the advantage that electrons can be injected into the wire by means of a relatively low applied biases.

The junctions can be used to control current flow and can be arranged to exhibit symmetric or asymmetric negative differential resistance so that the device may itself be used to control the input and output characteristics of the superconducting contact wire. To this end, the first and/or second normal material may comprise semiconductors or metals. A gate may be provided to control characteristics of the device.

BRIEF DESCRIPTION OF THE DRAWINGS

In order that the invention may be more fully understood, embodiments thereof will now be described by way of example with reference to the accompanying drawings, wherein:

FIGS. 1*a* and 1*b* are schematic energy diagrams of a junction device utilising two relatively non-transmissive junctions wherein FIG. 1*a* shows the situation for zero bias, and FIG. 1*b* shows that low transmission occurs for a small bias;

FIGS. 2*a* and 2*b* illustrate corresponding energy diagrams for a superconductor-normal metal junction device in accordance with the invention, in which FIG. 2*a* illustrates the case of zero bias whereas FIG. 2*b* shows high transmission at a small finite bias;

FIGS. 4*a*–4*d* illustrate energy diagrams corresponding to those of FIG. 2 for an arrangement in which the normal metal 1 is replaced by a semiconductor 4;

FIG. 6 is a graph illustrating the voltage-current characteristics of the device of FIG. 5;

DETAILED DESCRIPTION

Figure 1A:
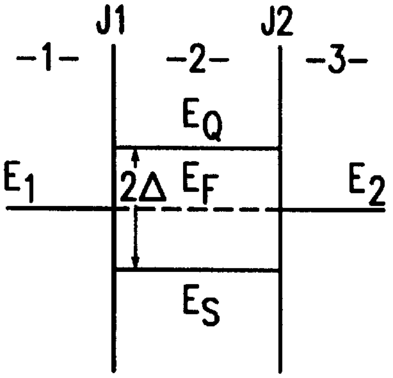
Figure 1B:
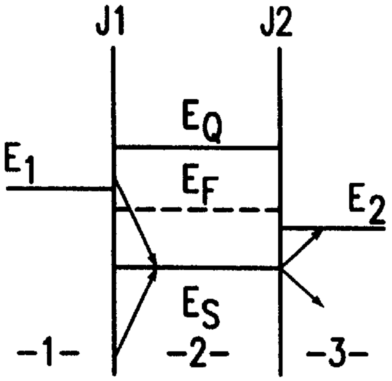

Referring to FIGS. 1*a* and 1*b*, these show the energy diagram for a normal material-superconductor-normal material sandwich with low transmission junctions. Normal material 1 which in this example is metal (but may be a semiconductor) forms a first tunnelling junction J1 with superconductor material 2, which, in turn forms the second junction J2 with normal metal 3. In the energy diagram of FIGS. 1*a* and 1*b*, $E_1$ and $E_2$ represent the Fermi levels in the normal material regions 1, 3. The equilibrium Fermi level $E_F$ for the superconductor material 2 is shown as a dotted line. The superconducting material exhibits an energy gap of width 2 $\Delta$ between energy states between the quasiparticle energy $E_Q$ and the pair energy $E_S$.

FIG. 1*a* shows the condition of zero bias, in which the Fermi levels $E_1$, $E_2$ of the normal metal regions 1, 3 align with the equilibrium Fermi level $E_F$ of the superconductor region 2. FIG. 1*b* shows the situation when a small bias is applied.

It will be seen that the Fermi level $E_1$ of normal material 1 is biased slightly above the equilibrium Fermi level $E_F$ for the superconductor 2 and the Fermi level $E_2$ of the normal material 3 is biased slightly downwardly from the Fermi level $E_F$. However, in this configuration, the system is not transmissive. The arrows in FIGS. 1*a* and 1*b* illustrate the limits of possible Andreev reflection. It will be seen that electron pairs can tunnel from the normal material into the superconducting material 2 but transport from the superconductor into the normal material 3 requires both Andreev reflection and the presence of holes to accept the lower energy electrons which occur in the pairs produced by the reflection. The conditions are thus not suitable for electron transport and the likelihood of transport remains very low until the offset bias for Fermi level $E_1$ is sufficient to match the quasiparticle energy $E_Q$ and the energy level $E_2$ is biased to match the pair energy $E_S$. Thus, a relatively large offset bias is required in order to achieve electron transmission through the low transmission junctions J1, J2.

Figure 3A:
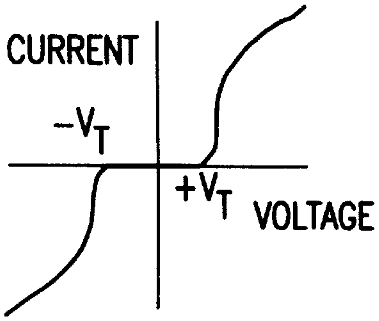
FIG. 3*a* is a graph of the voltage-current characteristic of the device of FIG. 1.

The resulting voltage-current characteristics for such low transmission interfaces is shown in FIG. 3*a* from which it will be seen that no current flows until the bias voltage is increased above a relatively high level $\pm V_T$, which corresponds to electron transport through quasiparticle energy states $E_Q$.

Figure 2A:
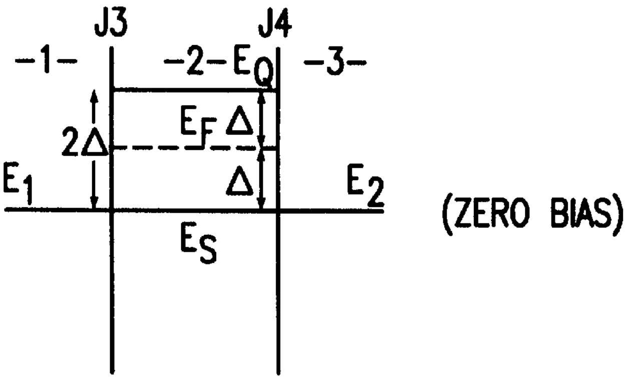
Figure 2B:
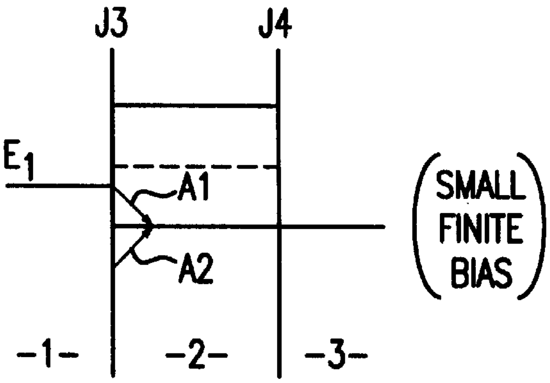

Referring now to FIGS. 2*a*, 2*b* this shows an arrangement in which relatively high transmission junctions J3, J4 are utilised, fabricated by appropriate selection of materials and fabrication procedures, in a manner known per se for individual junctions. In this case, Andreev reflection can occur at both junctions J3, J4. As shown in FIG. 2*a*, at zero bias, electrons from each of the metal regions 1, 3 will enter the pair level, charging the superconductor 2 until the pair energy $E_S$ matches the Fermi level $E_1$, $E_2$ for each of the metal regions 1, 3.

When a small bias is applied, as shown in FIG. 2*b*, the Fermi level $E_1$ of the metal 1 is shifted upwardly by an amount $\delta E<\Delta$ and the bias produces a voltage drop across the junction J3 rather than junction J4 because the Andreev reflection at J4 requires a temporal and spatial overlap of electrons with the appropriate energy wave vectors. Thus, electron pairs are injected into the superconductor pair level as shown schematically by arrows A1, A2 from the biased Fermi level $E_1$ and a corresponding level in the metal 1, symmetrically disposed below the pair energy level $E_S$ of the superconductor.

At the junction J4, Andreev reflection also occurs from the pair energy $E_S$ into the many available states above the Fermi energy, resulting in electron flow from the superconductor 2 into the metal 3.

Figure 3B:
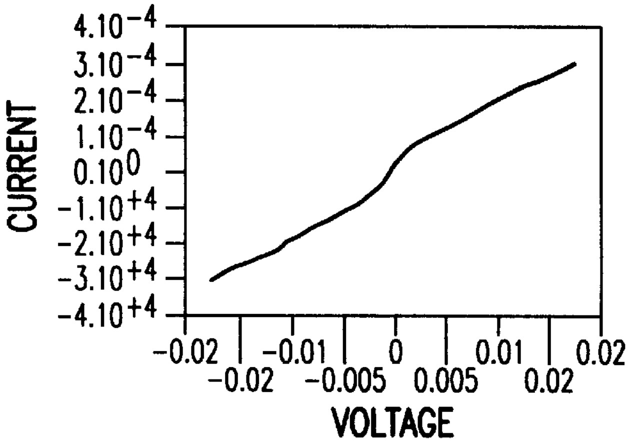
FIG. 3*b* is a graph of the voltage-current characteristic of the device of FIG. 2.

The resulting voltage-current characteristic is shown in FIG. 3*b* and it will be seen that current flow can be achieved without the impediment of a large threshold ($>\Delta/2$) as required in the configuration of FIGS. 1*a* and 1*b*.

FIGS. 4*a* and 4*b* illustrate a situation in which the metal region 1 is replaced by a semiconductor 4 having a band gap less than twice the superconductor gap. A semiconductor has a conduction band 5, and a valence band 6, separated by band gap 7.

Referring to FIG. 4*a*, with a very small bias, current can flow by Andreev reflection from the semiconductor conduction band 5 into the superconductor, electron pairs being taken from energy levels symmetrically disposed in the conduction band 5 above and below the electron pair level $E_S$ of the superconductor 2, as shown by arrows A3, A4. Current flows from the pair energy $E_S$ into conduction band 8 of metal 3, in the manner previously described.

As the bias is increased, the current flow is reduced as there are no occupied states symmetrically disposed about the pair energy $E_S$, as shown in FIG. 4*b*. Thus, Andreev reflection is not permitted in the direction of arrow X in FIG. 4*b*.

As the bias is increased further, the semiconductor band gap 7 straddles the pair energy $E_S$ symmetrically so that current can again flow with the Andreev reflected hole occurring in the valence band 6 so that electron pairs are produced as shown by arrows A5, A6. Thus, the current-voltage characteristics shows a negative differential resistance (NDR) as the bias is increased from the situation shown in FIG. 4*a* through to FIG. 4*c*. When the bias is in the condition shown in FIG. 4*c*, the device will emit light, as the valence band holes thermalise by combining with conduction band electrons, dependent on the semiconductor band gap.

Referring to FIG. 4*d*, when the device is reverse biased, since the region 3 is metallic, the device exhibits standard Andreev reflection at each of the junctions J3, J4, so that the characteristic corresponds to the negative going part of the characteristic shown in FIG. 3*b*, i.e. no NDR occurs.

Figure 5:
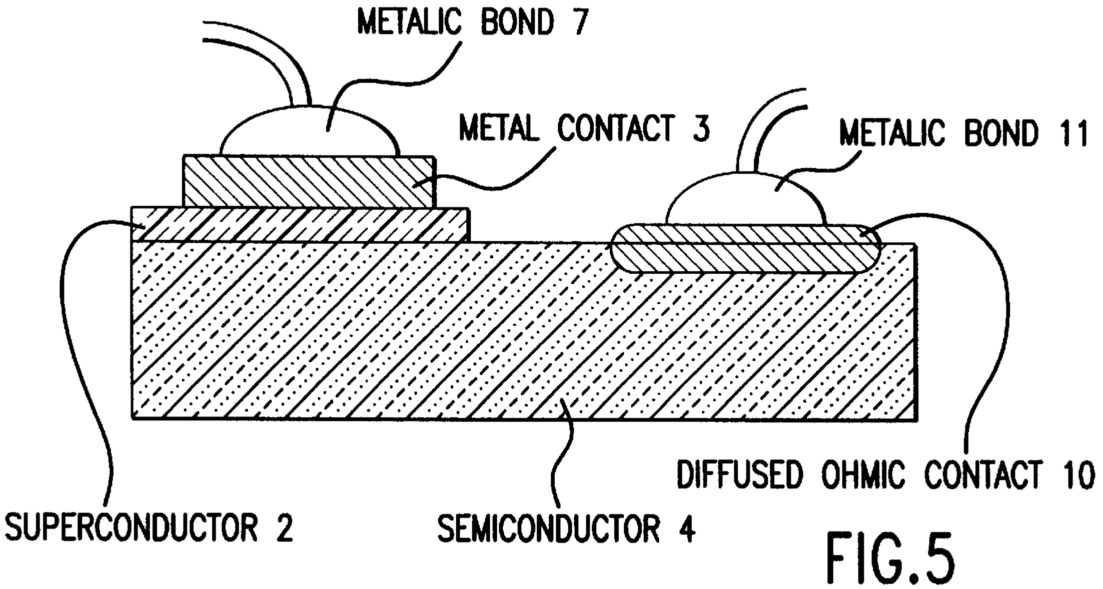
FIG. 5 illustrates a schematic example of a device in accordance with the invention which exhibits a negative differential resistance.

A schematic example of a device exhibiting the characteristics of FIG. 4*b* is shown in FIG. 5, in which the superconductor 2 is sandwiched between semiconductor 4 and metal contact 3. An external connection to the contact 3 is provided by a metallic bond 9, and a diffused ohmic contact 10 provides a connection to the semiconductor 4, with an external connection through metallic bond 11.

The device exhibits voltage-current characteristic shown in FIG. 6, in which region a corresponds to the process described with reference to FIG. 4*a*, region b is a region of NDR corresponding to FIG. 4*c* whereas region c corresponds to the process of FIG. 4*c*, which results in light emission. The reverse bias region d corresponds to FIG. 4*d*.

Figure 7:
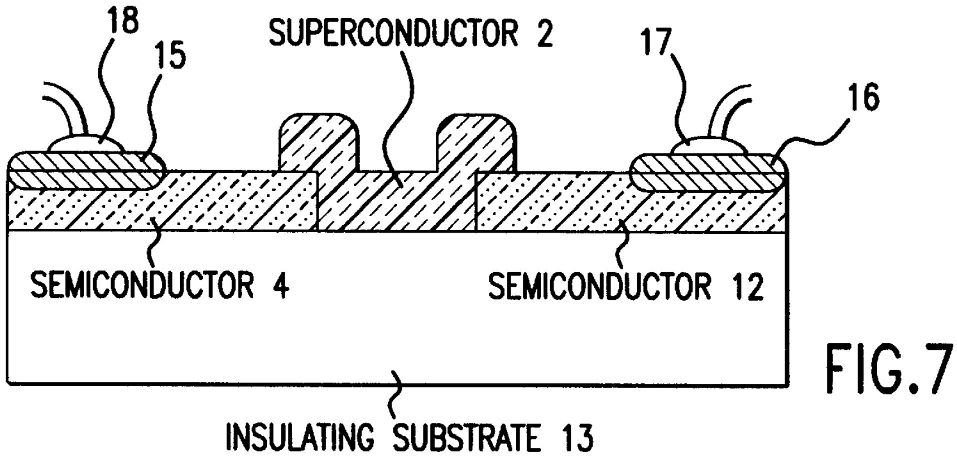
FIG. 7 illustrates another form of device in accordance with the invention, which exhibits negative differential resistance for both polarities of input voltage.

As a modification, the metallic region 3 may be replaced by a semiconductor so that under conditions of reverse bias, a negative differential resistance will be exhibited also. An example of a device exhibiting NDR for both polarities is shown in FIG. 7. In this device, the superconductor 2 is arranged between semiconductor regions 4, 12, deposited on an insulating substrate 13. External connections to the semiconductor regions 4, 12 are provided by ohmic contacts 15, 16 with associated metallic contacts 17, 18.

Figure 8:
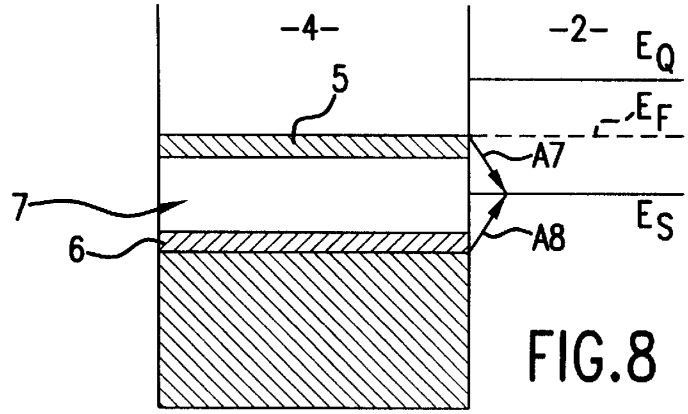
FIG. 8 is an energy diagram of a further device in accordance with the invention.

FIG. 8 illustrates another modification in which the nature of the Andreev reflections is used to create a non-equilibrium carrier distribution. Only one of the junctions is shown, J3, between p-type semiconductor region 4 and the superconducting material 2. The semiconductor has a conduction band 5 and valence band 6, spaced by a band gap 7. The pair energy $E_S$ is matched to the mid point of the band gap 7 so that Andreev reflection occurs as shown by arrows A7, A8. The Andreev reflection depletes both the conduction band and the top of the valence band and as a result, the semiconductor is inverted from an degenerate n-type to a degenerate p-type. This effect can be embodied in device in accordance with the invention.

Also, all of the described devices can be modified by the provision of a third contact (not shown), capacitively linked to the semiconductor 4, the superconductor 2 or the region 3. The resulting gate can be used to control the input or output of the device or hold an offset between the region 3 or 4 and the superconductor 2.

The invention has application to devices which use high temperature semiconductors for example to provide superconductor wires on a semiconductor substrate to provide connections between nanofabricated circuit devices, with the advantage that only a very small bias is needed to produce transmission along the superconductor, thus making an on-chip superconducting wire a practical proposition. The resulting superconducting wires thus provide high speed interconnects. Also, since the junctions in the device of the invention can themselves provide predetermined non-linear characteristics, the interconnects can contribute to the transfer function for an integrated circuit device.

Also the devices can be used in any structures using NDR, and as microwave oscillators.

What is claimed is:

1. A superconductor-normal conductor junction device comprising:

a region of superconducting material;

a first region of normal material forming a first junction with the superconducting material;

a second region of normal material forming a second junction with the superconducting material;

wherein a Fermi level of the first region of normal material is so arranged relative to a given energy level in the superconducting material that charge carriers in the first region of normal material undergo Andreev reflection at the first junction, resulting in pairs of the charge carriers entering said given energy level in the superconducting material, and a Fermi level of the second region of normal material being so arranged relative to said given level in the superconducting material that said charge carriers conduct from the superconducting material through the second region.

2. A junction device according to claim 1 wherein the first normal material comprises a semiconductor.

3. A junction device according to claim 1 wherein the second normal material comprises a semiconductor.

4. A junction device according to claim 1 wherein the second normal material comprises a metal.

5. A junction device according to claim 1 wherein the conduction characteristic between the first and second normal materials exhibits a negative differential resistance at least over a predetermined range of applied voltage.

6. A junction device according to claim 1 including means for applying a bias for controlling the Andreev reflection.

7. A junction device according to claim 1 including means for applying a bias to control conduction of said carriers from the superconducting material to the second region of normal material.

8. A junction device according to claim 1 wherein the superconducting material exhibits an energy gap of width (2Δ) between its pair energy level ($E_S$) and quasiparticle energy level ($E_Q$), and said given energy level comprises the pair energy level.

9. A junction device according to claim 8 including means for applying a bias such that the Fermi level of the first normal material is shifted by an amount less than said energy gap of width (2Δ).

10. A normal conductor-superconductor-normal conductor (N-S-N) device comprising:

a first normal conductor material;

a second normal conductor material;

a superconductor material disposed between said first and second normal conductor materials;

wherein the first normal conductor material and superconducting material are arranged so that a first junction of high transmissivity is formed so as to allow Andreev reflection to occur;

wherein the superconducting material and the second normal conductor material are arranged so that a second junction of high transmissivity is formed so as to allow Andreev reflection to occur; and the N-S-N device exhibiting an excess current when a potential, V, less than twice the superconducting gap energy of the superconducting material divided by electronic charge, 2Δ/e, is applied between the first and second normal conductor materials.

* * * * *